United States Patent [19]

Yoshida et al.

[11] Patent Number: 5,094,970
[45] Date of Patent: Mar. 10, 1992

[54] METHOD OF MAKING A LIGHT EMITTING DIODE ARRAY

[75] Inventors: Susumu Yoshida, Itami; Takafumi Nishioka, Fukuyama, both of Japan

[73] Assignee: Mitsubishi Denki Kabushiki Kaisha, Tokyo, Japan

[21] Appl. No.: 700,422

[22] Filed: May 15, 1991

Related U.S. Application Data

[62] Division of Ser. No. 513,878, Apr. 24, 1990, Pat. No. 5,045,895.

[51] Int. Cl.$^5$ ............ H01L 21/70; H01L 21/28
[52] U.S. Cl. ............ 437/51; 437/905; 437/906; 437/226; 148/DIG. 99
[58] Field of Search ............ 437/51, 905, 906, 226; 148/DIG. 99

[56] References Cited

U.S. PATENT DOCUMENTS

| | | | |
|---|---|---|---|
| 3,783,353 | 1/1974 | Pankove | 437/905 |
| 4,024,966 | 6/1991 | Dietrich et al. | 148/DIG. 99 |
| 4,361,950 | 12/1982 | Amick | 437/2 |
| 4,633,280 | 12/1986 | Takasu | 357/17 |
| 4,757,357 | 7/1988 | Varon et al. | 357/17 |
| 4,775,645 | 10/1988 | Kurata et al. | 357/17 X |
| 4,864,370 | 9/1989 | Gaw et al. | 357/17 |
| 4,951,098 | 8/1990 | Albergo et al. | 357/17 |
| 4,954,458 | 9/1990 | Reid | 437/51 |
| 4,978,639 | 12/1990 | Hua et al. | 437/226 |
| 4,989,059 | 1/1991 | Micheels et al. | 437/907 |

FOREIGN PATENT DOCUMENTS

| | | |
|---|---|---|
| 6037575 | 8/1983 | Japan . |
| 61-95956 | 5/1986 | Japan . |

*Primary Examiner*—Brian E. Hearn
*Assistant Examiner*—Linda Fleck
*Attorney, Agent, or Firm*—Oblon, Spivak, McClelland, Maier & Neustadt

[57] ABSTRACT

In a light emitting diode array, an N-electrode layer (32) is extended from the bottom surface to the top surface of a semiconductor body (30) through the side surface. PN junctions (42) are exposed to the cleavage surface (S) and light is emitted therefrom. Since the N-electrode layer and P-electrode layers (41) are located on a common surface, the LED array can be mounted on a base plate through a soldering process. The LED array can be used without a self-focus lens array in an electric printer for photography.

2 Claims, 7 Drawing Sheets

METHOD OF MAKING A LIGHT EMITTING DIODE ARRAY

This is a division of application Ser. No. 07/513,878, filed on Apr. 24, 1990, now U.S. Pat. No. 5,045,895.

BACKGROUND OF THE INVENTION

1. Field of the Invention

The present invention relates to a light emitting diode (LED) array employable in an electronic printer for photography, and particularly to a structure of P and N electrodes on the LED array.

2. Description of Prior Arts

Figure 1:
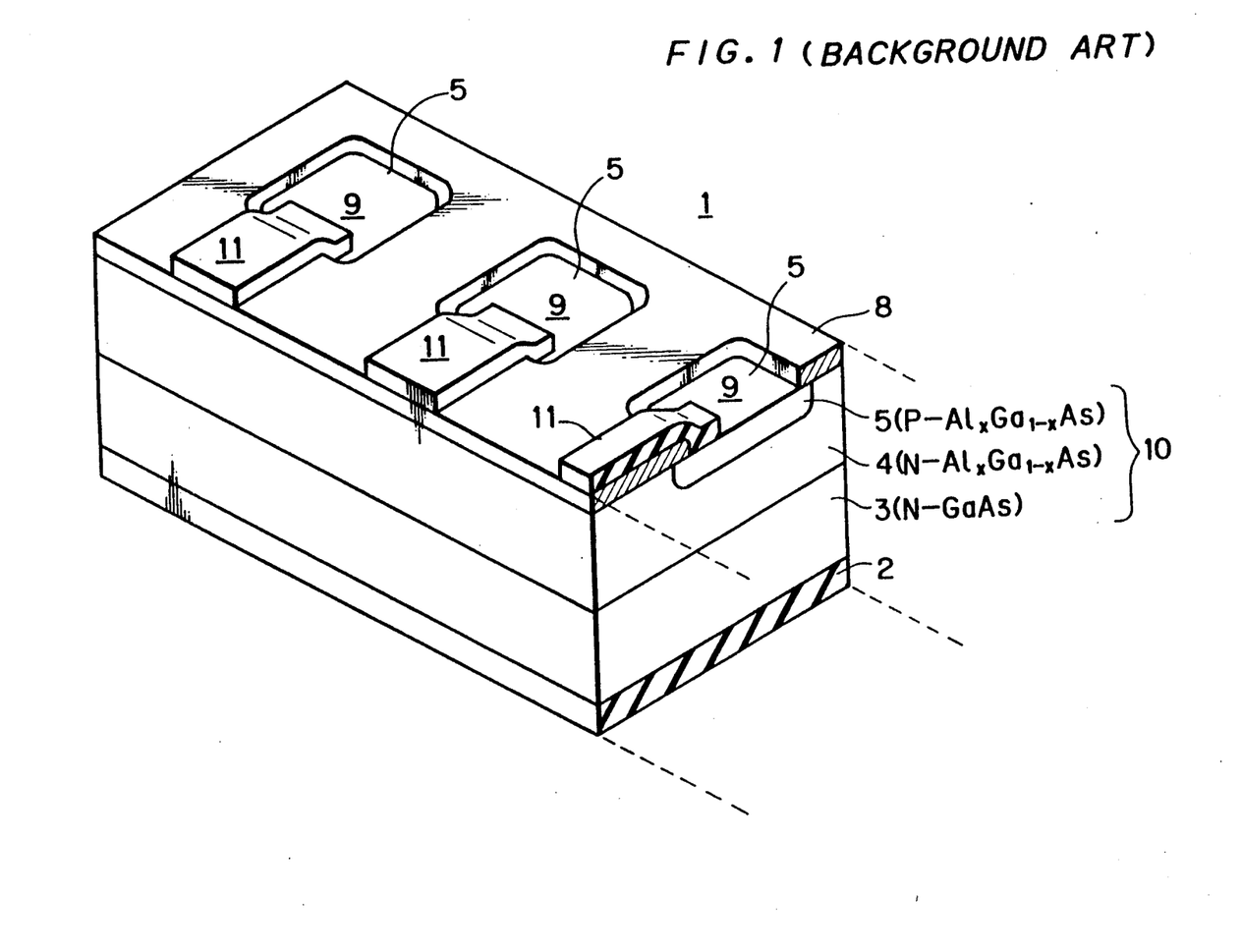
FIG. 1 is a perspective view of a conventional LED array with part broken away for clarity.

FIG. 1 illustrates the structure of a conventional LED array 1. The LED array 1 comprises a semiconductor body 10 having an N-GaAs layer 3, an N-$Al_xGa_{1-x}As$ layer 4 and P-$Al_xGa_{1-x}As$ regions 5. An N-electrode layer 2 is formed on the bottom surface of the semiconductor body 10, while an insulating layer 8 is provided on the top surface of the semiconductor body 10. The insulating layer 8 has a linear array of rectangular windows 9, which are defined on the P-regions 5. P-electrode layers 11 are formed on the insulating layer 8 and respective end portions thereof are in contact with the top surfaces of the P-regions 5 through the windows 9.

Figure 2:
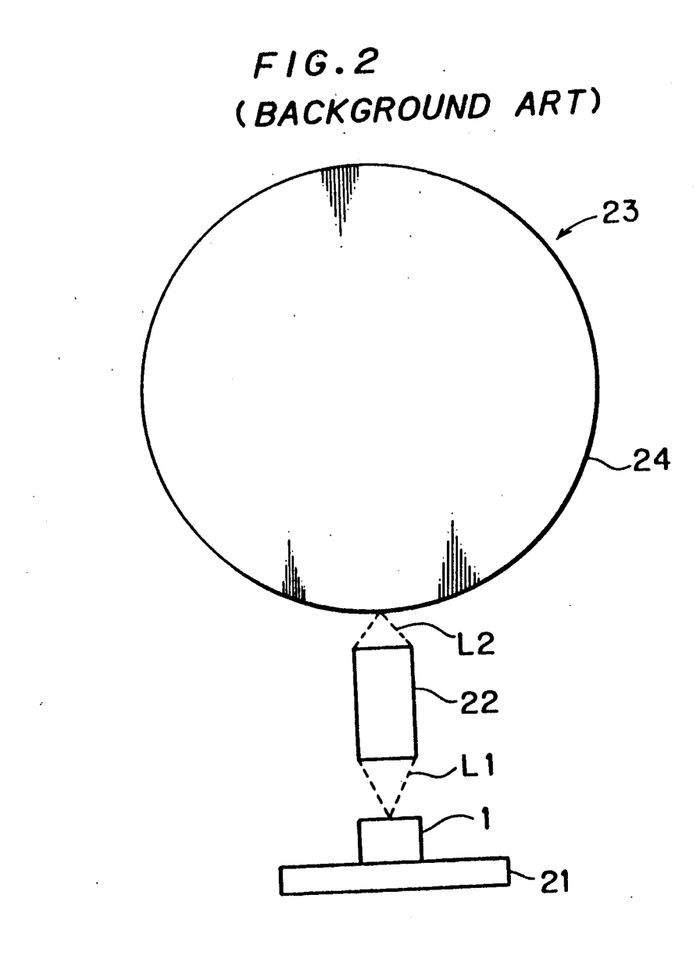
FIG. 2 is a schematic side view of a conventional electronic printer for photography in which the LED array shown in FIG. 1 is employed.

FIG. 2 is a schematic diagram showing the situation in which the LED array 1 is employed in an electronic printer for photography. The LED array 1 is fixed to a base plate 21, such as a printed board, and the electric connection between the LED array 1 and the base plate 21 is attained through die bonding and wire bonding. A self-focus lens array (SLA) 22 is supported by a supporting member (not shown) so that the windows 9 (FIG. 1) face to the SLA 22 across a gap therebetween. A photosensitive drum 23 is rotatably provided and the center axis of the drum 23 is located on a line passing through the LED array 1 and the SLA 22.

An image signal is transmitted to an LED drive circuit (not shown) and, in response to the image signal, the LED drive circuit selectively supplies electric power to the LEDs included in the LED array 1 through the electrodes 2 and 11. The LEDs supplied with the electric power generate light L1 at the PN junctions thereof and emit the light L1 through the windows 9. The SLA 22 converts the light L1 into converging light L2, which is applied to the photosensitive surface 24 of the drum 23. The SLA 22 is effective for preventing the light spot from spreading on the photosensitive surface 24 of the drum 23.

Prior to the exposure to the light L2, the photosensitive surface 24 of the drum 23 is electrostatically charged to a negative level. When the light L2 is applied to the photosensitive surface 24, only the part of the surface 24 exposed to the light L2 is discharged. Therefore, a latent image is obtained on the photosensitive surface 24 by repeating the light generating process while rotating the drum 23 around the axis thereof. Then, the photosensitive surface 24 is supplied with toner charged to a negative level, and the toner stays only on the discharged part of the surface 24 since the toner cannot stay on the non-discharged part due to an electrostatic repulsive force. The toner staying on the surface 24 is transferred onto a paper, and then, the image thus obtained is fixed by heat and pressure.

The transmission efficiency of light is about several percent in the LED array head consisting of the LED array 1, the base plate 21, the SLA 22 and a driver (not shown). This is because the SLA 22, which has a relatively low transmission efficiency of light, should be provided in the conventional LED array head.

Furthermore, since the electrode layers 2 and 11 are located on opposite surfaces of the semiconductor body 10, the LED array 1 must be mounted on the base plate 21 through die bonding and wire bonding. Accordingly, a complex process is required in mounting the LED array 1 on the base plate 21 and the mounting of the LED array 1 is restricted to such an orientation that the light emitting surface is parallel to the surface of the base plate 21.

SUMMARY OF THE INVENTION

According to the present invention, a light emitting diode array comprises:

(a) a semiconductor layer of a first conductivity type;
(b) semiconductor regions of a second conductivity type which are selectively formed in a top surface of the semiconductor layer and which form PN junctions with the semiconductor layer, the PN junctions being exposed at a first side surface of the semiconductor layer;
(c) a first electrode layer provided on a bottom surface of the semiconductor layer; and (d) an electrode pattern which has second electrode layers provided on top surfaces of the semiconductor regions, respectively. Preferably, the LED array further comprises (e) a multi-layer structure having an insulating layer and a conductivity layer and provided on at least a second side surface of the semiconductor layer so that the insulating layer is sandwiched between the semiconductor layer and the conductive layer. The conductive layer has a first portion connected to one of the first electrode layer and the electrode pattern and a second portion located on a surface on which the other of the first electrode layer and the electrode pattern is located. The first and second portions of the conductive layer are electrically connected to each other.

Preferably, the insulating layer includes: a first portion formed on the second side surface; and a second portion formed on the top surface and having windows on the semiconductor regions.

The first portion of the conductive layer is located on the first portion of the insulating layer and is connected to the first electrode layer at a boundary between the second side surface and the bottom surface.

On the other hand, the second portion of the conductive layer is located on the second portion of the insulating layer and is electrically isolated from the electrode pattern.

The present invention is also directed to a method of fabricating such a light emitting diode.

According to the present invention, the method comprises the steps of: (a) preparing a semiconductor wafer having a semiconductor layer of a first conductivity type therein: (b) forming a matrix array of semiconductor regions of a second conductivity type in a top surface of the semiconductor layer; (c) forming a first insulating layer on the top surface of the semiconductor layer; (d) selectively removing the first insulating layer to obtain windows on the semiconductor regions; (e) providing first conductive layers in the windows; (f) cutting the wafer into strips each having a linear array of the semiconductor regions; (g) forming a second insulating layer on a side surface of a strip obtained in the step (f), the second insulating layer being connected to the first insulating layer on the strip; and (h) providing a second conductive layer having a first portion located on a bottom surface of the strip, a second portion located on the second insulating layer and a third portion located on a part of the first insulating layer of strip.

Accordingly, an object of the present invention is to provide an LED array usable at a high transmission efficiency of the light.

Another object is to provide an LED array which can be easily mounted on a base plate in the orientation where the light emitting surface of the LED array is perpendicular to the surface of a base plate.

These and other objects, features, aspects and advantages of the present invention will become more apparent from the following detailed description of the present invention when taken in conjunction with the accompanying drawings.

DESCRIPTION OF PREFERRED EMBODIMENTS

Figure 3:
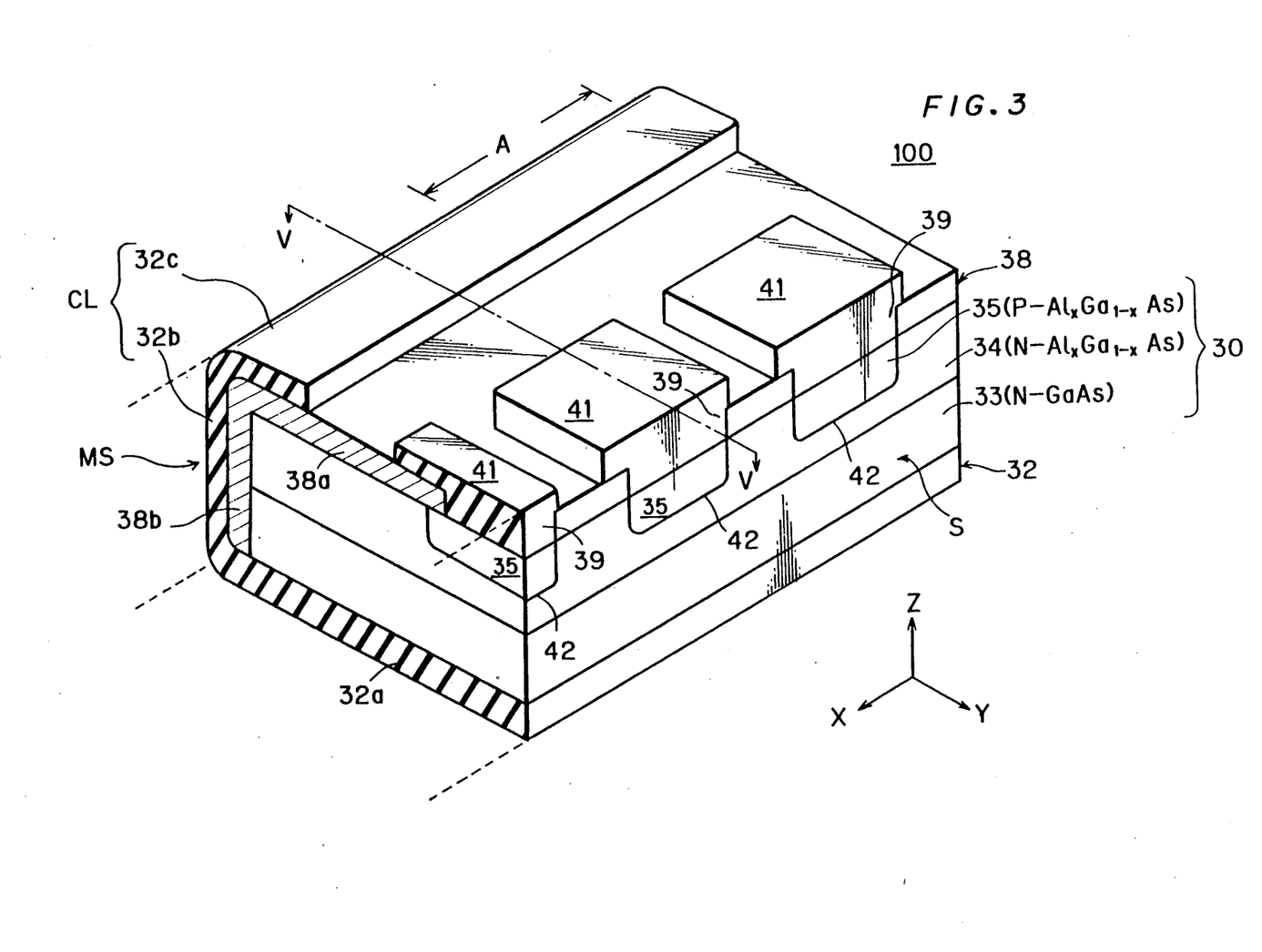
FIG. 3 is a perspective view of an LED array according to a preferred embodiment of the present invention with part broken away for clarity.

Referring to FIG. 3, there is shown an LED array 100 according to a preferred embodiment of the present invention, where part thereof is broken away for clarity and an XYZ-coordinate axes are defined for representing respective directions. The LED array 100 comprises a semiconductor body 30 having an N-GaAs buffer layer 33 on which an N-Al$_x$Ga$_{1-x}$As layer 34 is formed. A linear array of P-Al$_x$Ga$_{1-x}$As regions 35 is selectively provided in the top surface of the N-Al$_x$Ga$_{1-x}$As layer 34, whereby PN junctions 42 are formed between the layer 34 and the regions 35.

An insulating layer 38 is provided on the semiconductor body 30. The insulating layer 38 has a horizontal portion 38a covering the top surface of the semiconductor body 30 and a vertical portion 38b covering the back side surface of the semiconductor body 30. A linear array of windows 39 located on the P-regions 35 is formed in the horizontal portion 38a of the insulating layer 8. The windows 39 are broken windows whose respective halves are broken away at a cleavage plane S. A linear array of P-electrode layers 41 is provided so as to fill the windows 39, and the top surface of the P-electrode regions 41 are higher than that of the horizontal portion 32a of the insulating layer 32 in the vertical direction Z.

The LED array further comprises an N-electrode layer 32, which has a horizontal bottom portion 32a coverting the bottom surface of the semiconductor body 30, a vertical portion 32b covering the vertical portion 38b of the insulating layer 38 and a horizontal top portion 32c covering a part of the top portion 38a of the insulating layer 38. The horizontal top portion 32c of the N-electrode layer 32 is electrically insulated from the P-electrode layers 41. It is to be noted that the horizontal top portion 32c of the N-electrode layer 32 and the P-electrode layers 41 are located on a same surface, i.e., the top surface of the horizontal portion 38a of the insulating layer 38. The front side surface of the LED array 100 is the cleavage plane and is exposed to the external space. Although only three LED cells are shown in FIG. 3, the LED array 100 has a number of LED cells aligned in the horizontal direction X.

It other words, a multi-layer structure MS having the insulating layer 38 and a conductive layer CL is provided on the area extending from the side surface to the top surface. The conductive layer CL is united with the horizontal bottom portion 32a of the N-electrode layer 32. The multi-layer structure MS is provided for extending N-electrode layer 32 to the top surface of the semiconductor body 30 on which an electrode pattern consisting of the P-electrode layers 41 is provided.

Figure 4:
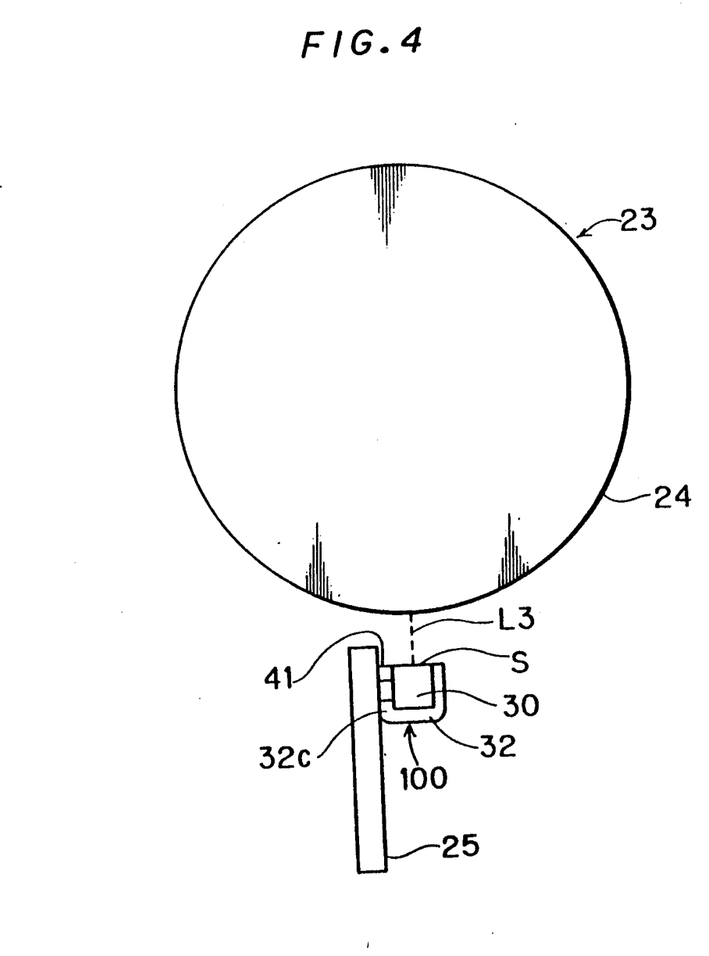
FIG. 4 is a schematic side view of an electronic printer for photography in which the LED array shown in FIG. 3 is employed.

FIG. 4 is a schematic side view of an electronic printer for photography in which the LED array 100 is employed. The LED array 100 is mounted on a base plate 25, such as a printed board, through a bump wiring process, i.e., a process of soldering the P-electrode layers 41 and the portion 32c of the N-electrode layer 32 onto the surface of the base plate 25. A device thus obtained is so oriented that the cleavage plane S faces the photosensitive surface 24 of a rotatable photosensitive drum 23.

When an image signal is transmitted to a drive circuit (not shown) and the drive circuit selectively applies an electric voltage across the N-electrode layer 32 and the P-electrode layers 41, the LED cells in the LED array 100 selectively generate light L3 at the PN junctions 42 (FIG. 3). The light L3 consists of narrow light beams and is emitted from the cleavage plane S onto the photosensitive surface 24 which is previously charged. Light emission from the windows 39 is prevented since the windows 39 are filled with the P-electrode layers 41. A latent image which is obtained on the photosensitive surface 24 by repeating the light-emission process while rotating the drum 23 is transferred to paper through the same process with the conventional printer.

The LED array head shown in FIG. 3 has the following advantages:

(1) Since the P-electrode layers 41 and the portion 32c of the N-electrode layer 32 are located on the common surface, the LED array 100 can be mounted on the base plate 25 in the orientation where the light-emitting surface S is perpendicular to the mounting surface of the base plate 25. A complex process of mounting the LED array is not required because the electrodes 41 and 32c have relatively large areas and the LED array 100 can be fixed to the base plate 25 through a dump wiring process without causing a high contact resistance.

(2) The light L3 is not a spreading light but a set of narrow beams from the cleavage surface S, and therefore, relatively small spots can be obtained on the photosensitive surface 24 without an SLA. As a result, the transmission efficiency of light in the LED array head is improved as compared with the conventional one, and the cost for fabricating the LED array head and the electric power for driving the same can be decreased.

A process of fabricating the LED array 100 is as follows:

First, an N-GaAs substrate or wafer 51 (FIG. 5A) is prepared and an N-Al$_x$Ga$_{1-x}$As layer 52 is formed on the substrate 51 through an epitaxial growth technique. Then, a mask layer 53 (FIG. 5B) is formed on the top surface of the N-layer 52 and a matrix array of windows 54 is formed. P-type impurity ions are selectively implanted through the windows 54 to form a matrix array of P-Al$_x$Ga$_{1-x}$As regions or wells 55 in the top surface of the N-layer 52. Then, the mask layer 53 is removed from the top surface, and then, an insulating layer 56 (FIG. 5c) is formed on the top surface of the N-layer 52. A matrix array of windows 57 located on the P-regions 55 is formed through a photolithography process. An aluminum layer covering the insulating layer 56 and the P-regions 55 is formed and then is selectively removed so that P-electrode layers 58 are obtained. The P-electrode layers 58 are in contact with the P-regions 55 through the windows 57 and the top surfaces of the P-electrode regions 55 are higher than the top surface of the insulating layer 56. Furthermore, P-electrode regions 58 have parts 58a located on the insulating layer 56. Then, the wafer is cut into strips through a dicing process along lines LN.

Figure 5A:
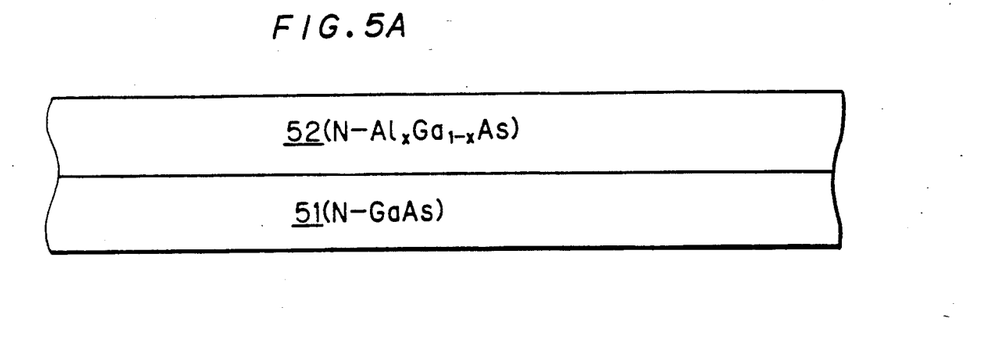
FIGS. 5A through 5F are sectional views showing a process of fabricating the LED array shown in FIG. 3.
Figure 5B:
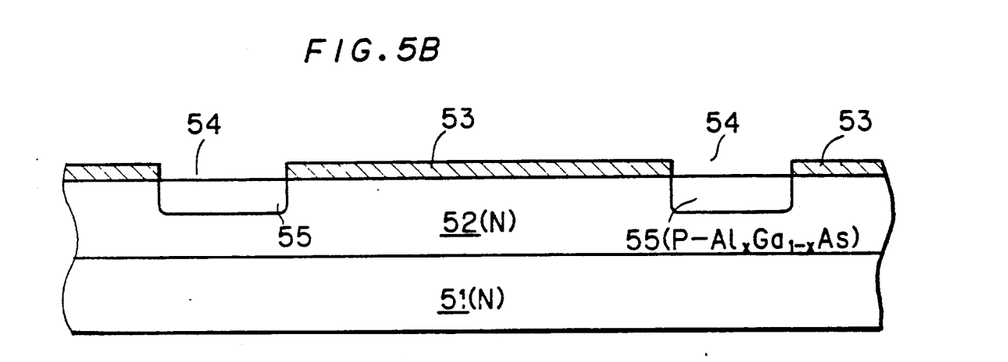
Figure 5C:
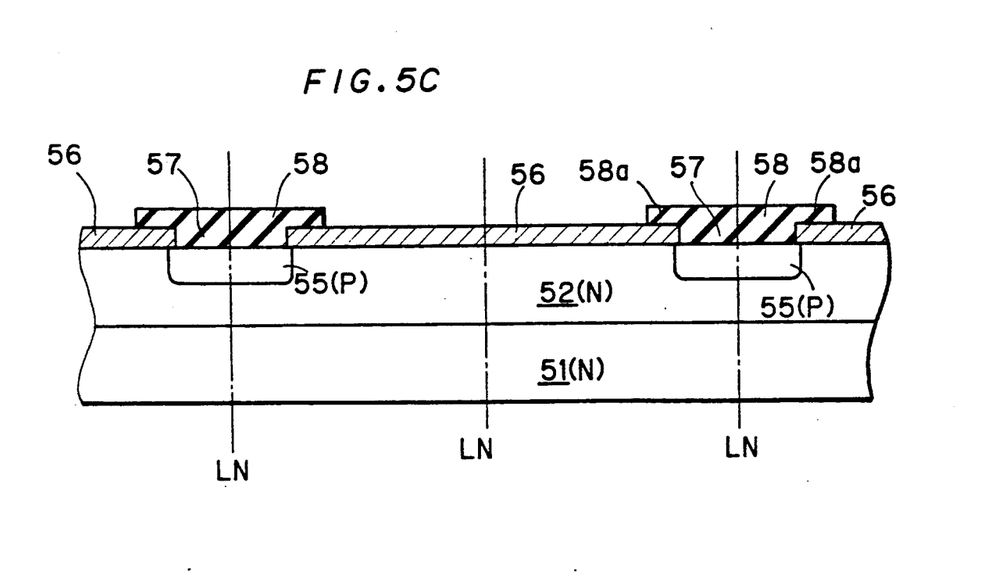
Figure 5D:
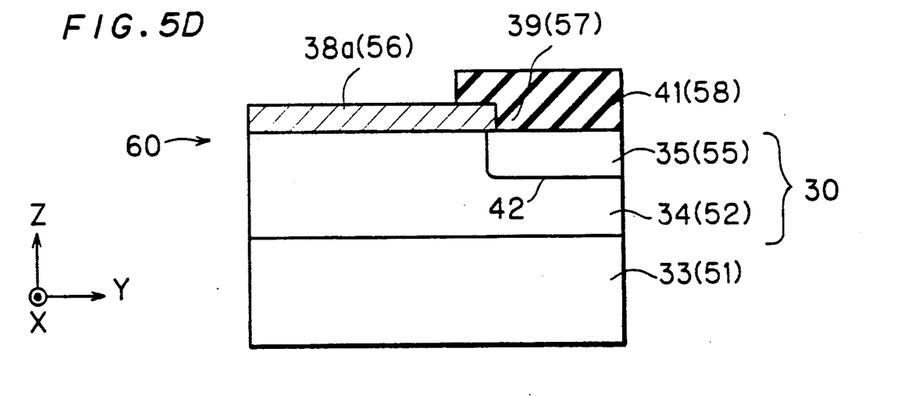

One of the strips thus obtained is shown in FIG. 5D, which is somewhat enlarged as compared with FIGS. 5A through 5C for convenience of illustration. The strip 60 extends in the direction X perpendicular to the drawing sheet. The layers 51, 52, 55, 56 and 58 are renumbered with reference numerals 33, 34, 35, 38a and 41, respectively, in order to clarify that the former are those for the wafer while the latter are those for the strip 60. Similarly, broken windows 39 aligned in the direction Z correspond to the windows 57. A semiconductor body 30 consists of the layers 33 and 34 and the regions 35, where the P-regions 35 are linearly aligned in the direction X.

Figure 5E:
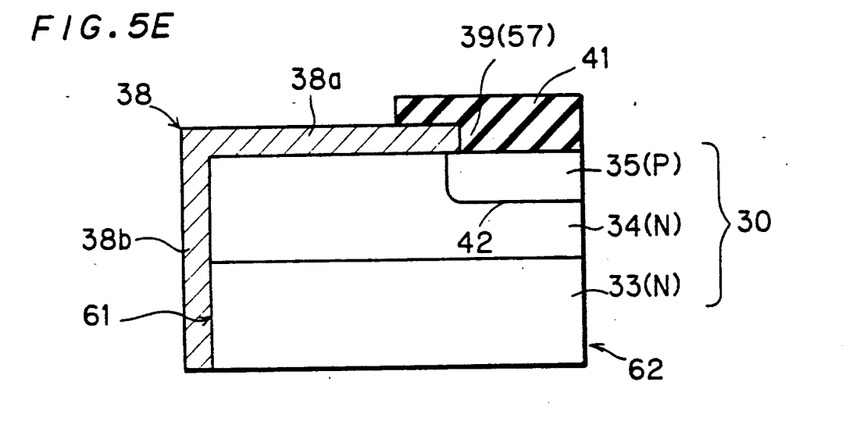

In the next process step, an insulating layer 38b (FIG. 5E) is formed on a side surface 61 of the semiconductor body 30, the side surface 61 being opposite to another side surface 62 on which the P-region 35 is exposed. The insulating layers 38a and 38b are made of a same material, e.g., silicon oxide, so that the layers 38a and 38b are united with each other to provide a hook-shaped insulating layer 38.

Figure 5F:
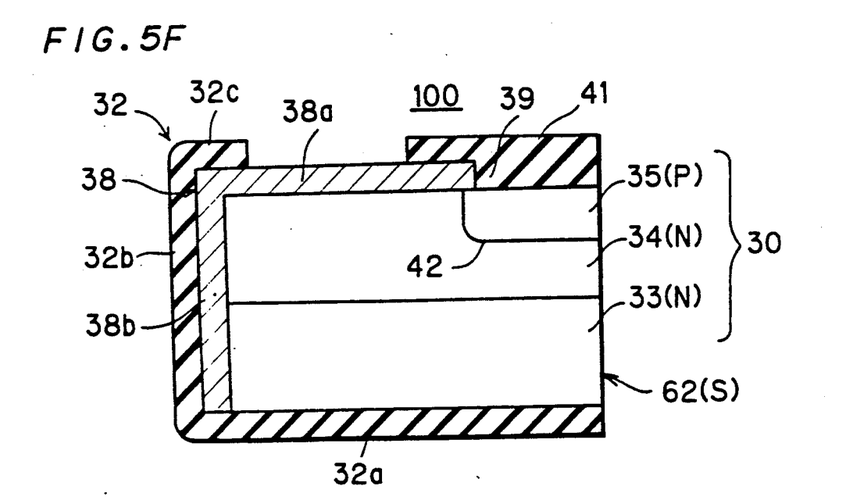

Then, aluminum paste is applied to the insualting layer 38 and the bottom surface of the semiconductor body 30, and then is hardened. A part of the aluminum located on the top surface of the insulating layer 38 is selectively removed through a photolithography process to thereby obtain an N-electrode layer 32 (FIG. 5F) having a horizontal bottom partion 32a, a vertical portion 32b and a horizontal top portion 32c. An LED array 100 thus obtained in FIG. 5F corresponds to that shown in FIG. 3, where FIG. 5F is the cross section along line V—V in FIG. 3.

Figure 6A:
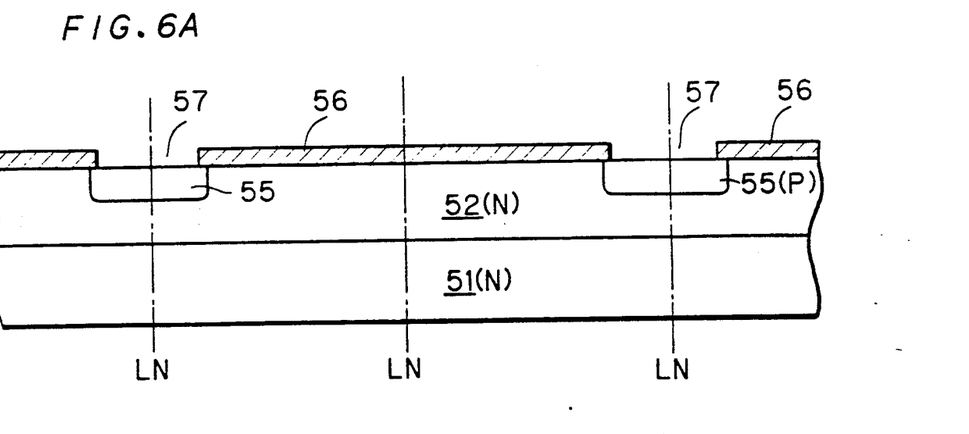
FIGS. 6A through 6D are sectional views showing a modification in the process of FIGS. 5A through 5F.
Figure 6B:
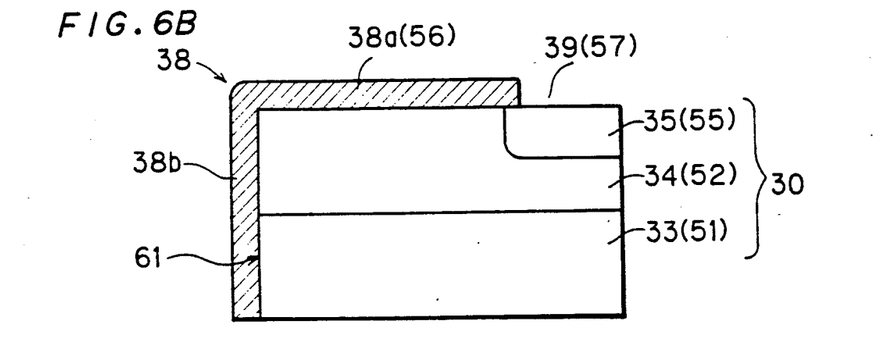

Another process of fabricating the LED array 100 is described below. In this process, the process steps shown in FIGS. 5A and 5B are also applied. After removing the mask layer 53, an insulating layer 56 shown in FIG. 6A is formed. Windows 57 are formed in the insulating layer 56 on the P-regions 55 and the wafer is cut into strips through a dicing process along lines LN. Then, as shown in FIG. 6B as an enlarged cross section, an insulating layer 38b is formed on the side surface 61 of the semiconductor body 30. The renumbering of the layers 51, 52, 55 and 56 is similar to that in FIG. 5D.

Figure 6C:
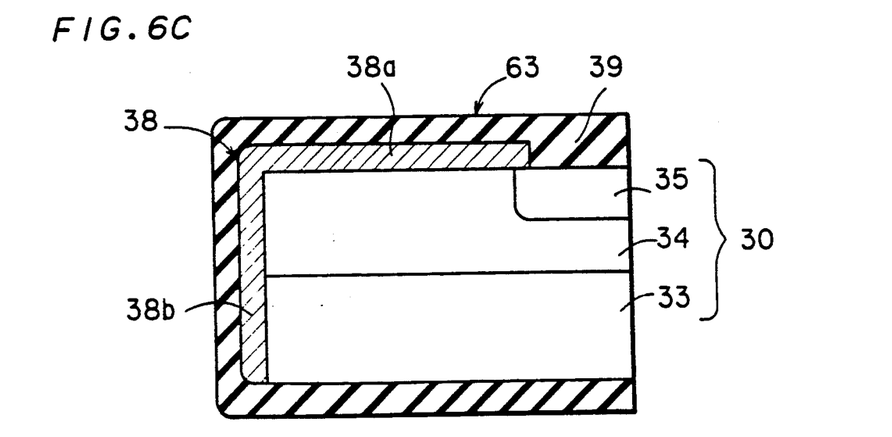
Figure 6D:
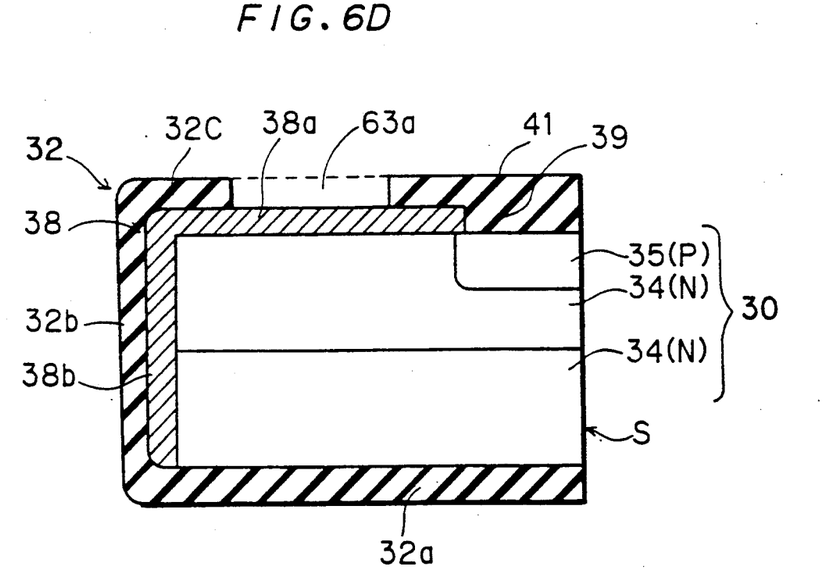

After obtaining an insulating layer 38 having the horizontal portion 38a and the vertical 38b, aluminum paste 63 (FIG. 6C) is applied to respective surfaces of the insulating layer 32, the bottom surface of the semiconductor body 30 and the respective inner surfaces in the windows 39. Then, the aluminum paste layer 63 is hardened and a portion 63a (FIG. 6D) of the aluminum layer 63 which is located on the horizontal portion 38a of the insulating layer 38 is selectively removed through a photolithography process. As a result, the aluminum layer 63 is divided into P-electrode layers 41 and an N-electrode layer 32 which are electrically insolated from each other. The N-electrode layer 32 consists of horizontal portions 32a and 32c and a vertical portion 32b. FIG. 6D also corresponds to the cross section of FIG. 3 long the line V—V.

Figure 7:
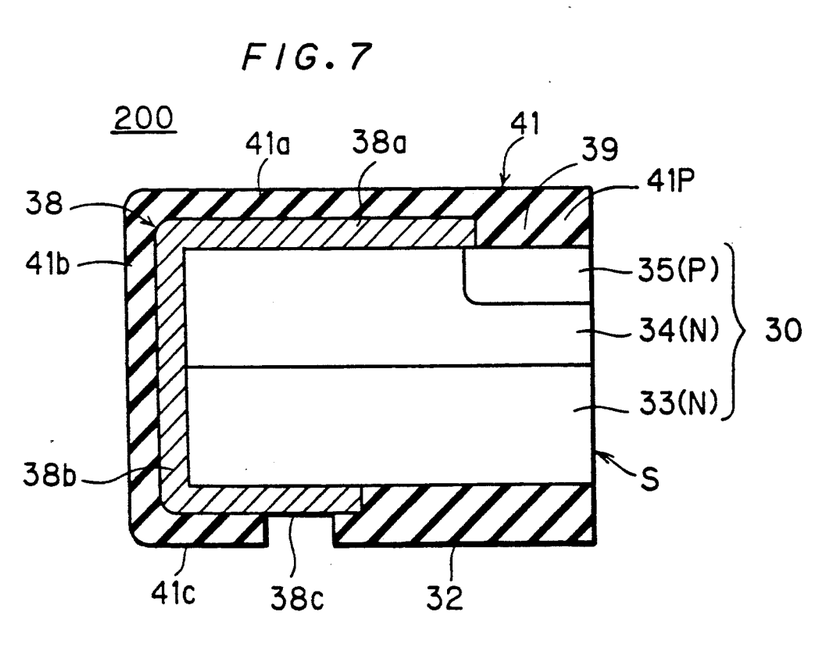
FIG. 7 is a sectional view showing an LED array according to another embodiment of the present invention.

FIG. 7 is a cross section of an LED array 200 according to another prefered embodiment of the present invention. In the LED array 200, each of P-electrode layers 41 has portions 41P and 41a–41c. The electrode portion 41P fills the corresponding window 39 and the first horizontal portion 41a extends on the horizontal top portion 38a of an insulating layer 38. The vertical portions 41b extends on the vertical portion 38b of the insulating layer 38, and the second horizontal portion 41c is selectively formed on the horizontal bottom portion 38c of the insulating layer 38. These portions 41a–41c and 41P are united with each other in each LED cell.

On the other hand, an N-electrode layer 32 is selectively formed on the bottom surface of the semiconductor body 30, and is electrically isolated from the horizontal bottom portion 41c of each P-electrode layer 41. The LED array 200 is mounted on a base plate such that the bottom surface in FIG. 7 is fixed to the mounting surface of the base plate.

Incidentally, the conductivity types "P" and "N" in the above-described embodiments may be exchanged with each other. Furthermore, the present invention can be applied to a single LED cell as well as an LED array. The single LED cell may have a construction corresponding to the section A shown in FIG. 3.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A method of fabricating a light emitting diode, comprising the steps of:
   (a) preparing a semiconductor wafer having a semiconductor layer of a first conductivity type therein:
   (b) forming a matrix array of semiconductor regions of a second conductivity type in a top surface of said semiconductor layer;
   (c) forming a first insulating layer on said top surface of said semiconductor layer;
   (d) selectively removing said first insulating layer to obtain windows on said semiconductor regions;
   (e) providing first conductive layers in said windows;
   (f) cutting said wafer into strips each having a linear array of said semiconductor regions;
   (g) forming a second insulating layer on a side surface of a strip obtained in the step (f); said second insulating layer being connected to said first insulating layer on said strip; and (h) providing a second conductive layer having a first portion located on a bottom surface of said strip, a second portion located on said second insulating layer and a third portion located on a part of said first insulating layer of said strip.

2. A method of fabricating a light emitting diode, comprising the steps of:

(a) preparing a semiconductor wafer having a semiconductor layer of a first conductivity type therein:

(b) forming a matrix array of semiconductor regions of a second conductivity type in a top surface of said semiconductor layer;

(c) forming a first insulating layer on said top surface of said semiconductor layer;

(d) selectively removing said first insulating layer to obtain windows on said semiconductor regions;

(e) cutting said wafer into strips each having a linear array of said semiconductor regions;

(f) forming a second insulating layer on a side surface of a strip obtained in the step (e), said second insulating layer being connected to said first insulating layer on said strip;

(g) providing a conductive layer on top and bottom surfaces of said strip and on said first and second insulating layers; and (h) selectively removing said conductive layer on said first insulating layer to obtain:

a first electrode layer which covers said bottom surface of said strip and said second insulating layer and which partially covers said first insulating layer on said strip; and second electrode layers filling said windows on said strip, respectively.

* * * * *